United States Patent
Shin et al.

(10) Patent No.: US 7,633,087 B2
(45) Date of Patent: Dec. 15, 2009

(54) SEMICONDUCTOR THIN FILM USING SELF-ASSEMBLED MONOLAYERS AND METHODS OF PRODUCTION THEREOF

(75) Inventors: Hyeon Jin Shin, Suwon-Si (KR); Young Su Chung, Suwon-Si (KR); Hyun Dam Jeong, Suwon-Si (KR); Sang Heon Hyun, Suwon-Si (KR); Jong Baek Seon, Seoul (KR)

(73) Assignee: Samsung Corning Precision Glass Co., Ltd. (KR)

( * ) Notice: Subject to any disclaimer, the term of this patent is extended or adjusted under 35 U.S.C. 154(b) by 492 days.

(21) Appl. No.: 11/417,026

(22) Filed: May 3, 2006

(65) Prior Publication Data

US 2007/0117279 A1    May 24, 2007

(30) Foreign Application Priority Data

Nov. 22, 2005  (KR) ............. 10-2005-0111745

(51) Int. Cl.
  *H01L 35/24*   (2006.01)
  *H01L 51/00*   (2006.01)
(52) U.S. Cl. ............................ 257/40; 257/E51.001
(58) Field of Classification Search ............... 257/9, 257/40
  See application file for complete search history.

(56) References Cited

U.S. PATENT DOCUMENTS

| 5,997,958 A | * 12/1999 | Sato et al. .......... 427/468 |
| 2004/0161873 A1 | 8/2004 | Dimitrakopoulos et al. ... 438/99 |
| 2004/0266148 A1 | * 12/2004 | Yim et al. .......... 438/497 |

FOREIGN PATENT DOCUMENTS

JP     2005281019 A  * 10/2005
WO  WO 2004/005587 A2   1/2004

OTHER PUBLICATIONS

Machine Translation of JP 2005-281019.*

* cited by examiner

*Primary Examiner*—Kenneth A Parker
*Assistant Examiner*—Anthony Ho
(74) *Attorney, Agent, or Firm*—Cantor Colburn LLP (57) ABSTRACT

A semiconductor thin film using a self-assembled monolayer (SAM) and a method for producing the semiconductor thin film are provided. According to the semiconductor thin film, a uniform inorganic seed layer is formed by using the self-assembled monolayer so that the adhesion between an insulating layer and a semiconductor layer is enhanced and thus the surface tension is reduced, thereby allowing the semiconductor thin film to have high quality without defects.

10 Claims, 4 Drawing Sheets

SEMICONDUCTOR THIN FILM USING SELF-ASSEMBLED MONOLAYERS AND METHODS OF PRODUCTION THEREOF

BACKGROUND OF THE INVENTION

This non-provisional application claims priority under 35 U.S.C. § 119(a) to Korean Patent Application No. 2005-11745 filed on Nov. 22, 2005, the entire contents of which are hereby incorporated by reference.

FIELD OF THE INVENTION

The present invention relates to a semiconductor thin film manufactured by using a self-assembled monolayer (SAM). It also relates to a method for producing the semiconductor thin film. More particularly, the present invention relates to a semiconductor thin film comprising a self-assembled monolayer and an inorganic seed layer formed between an insulating layer and a semiconductor layer so that the adhesion between the insulating layer and the semiconductor layer is enhanced and the crystallinity of the semiconductor thin film is improved.

DESCRIPTION OF THE RELATED ART

Flat panel displays, such as liquid crystal displays and organic electroluminescence displays, include a number of thin film transistors (TFTs) for driving the devices. Thin film transistors comprise a gate electrode, a gate insulating layer, source and drain electrodes, and a semiconductor layer activated in response to the driving of the gate electrode.

A semiconductor layer comprises a conductive channel material in which a current flowing between source and drain electrodes is modulated by an applied gate voltage. Amorphous silicon (a-Si) and polycrystalline silicon (poly-Si) are mainly used as channel materials in the semiconductor layers. A great deal of research has been conducted on organic semiconductor materials, such as pentacene and polythiophene. Particularly, considerable research have been undertaken in developing inorganic semiconductor materials, such as silicon-based semiconductor materials that are capable of covalent bonding. These can achieve high charge carrier mobility and can be prepared by low-cost processes. An example of a low cost process is a wet process.

One of the most important factors in the fabrication of a variety of electronic devices using organic and inorganic semiconductors is the quality of interfaces between a semiconductor layer and other layers, e.g., the insulating layer. In this connection, numerous attempts have been made to control the metal contact properties of semiconductors by using self-assembled monolayers and other kinds of doped contacts.

For example, U.S. Patent Publication No. 2004/0161873 discloses organic thin film transistors comprising a self-assembled monolayer formed between an insulating layer and an organic semiconductor layer.

Further, PCT Publication WO 2004/005587 discloses a method for producing a nanopattern by using CdS quantum dots. According to this method, however, the interfacial adhesion of an inorganic semiconductor layer is limited because the CdS quantum dots are not electrically connected to one another.

SUMMARY OF THE INVENTION

Therefore, the present invention overcomes the problems of the prior art. The present invention discloses a semiconductor thin film that has not only enhanced adhesion between an insulating layer and a semiconductor layer but also possesses improved crystallinity.

The present invention also provides a method for producing the semiconductor thin film.

In accordance with one aspect of the present invention, there is provided a semiconductor thin film comprising a self-assembled monolayer, an inorganic seed layer and a semiconductor layer formed in this order on an insulating layer wherein the self-assembled monolayer is formed from a precursor compound represented by Formula 1 below:

(1)

wherein X is selected from the group consisting of —SH, —NH$_2$, —SO$_3$H, —SeH, —C$_5$H$_4$N, —COSeH, —COSH, —SH, —OH, —COOH, —CONHOH, —C$_6$H$_4$N$_3$, —NH—C$_6$H$_4$N$_3$, —O—C$_6$H$_4$N$_3$, —OC(=O)C$_6$H$_4$N$_3$, —OPO$_3$H$_2$, —PO$_3$H$_2$, amino, and phosphinyl; (ARE SeH and COSeH correct?)

Y is selected from the group consisting of substituted and unsubstituted C$_1$-C$_{10}$ alkylene, substituted and unsubstituted C$_1$-C$_{10}$ alkenylene, substituted and unsubstituted C$_1$-C$_{10}$ alkynylene, substituted and unsubstituted C$_6$-C$_{20}$ arylene, and substituted and unsubstituted C$_6$-C$_{20}$ arylalkylene groups; and R$_1$, R$_2$ and R$_3$ are each independently selected from the group consisting of a hydrogen atom, substituted and unsubstituted C$_1$-C$_3$ alkyl groups, substituted and unsubstituted C$_1$-C$_{10}$ alkoxy groups, and a halogen atom, with the proviso that at least one of R$_1$, R$_2$ and R$_3$ is a hydrolyzable group.

In one embodiment of the present invention, the structure of the inorganic seed layer is represented by Formula 2 below:

(2)

wherein M is a metal atom selected from the group consisting of Group II, III and IV elements; and X is a Group VI chalcogen element.

In accordance with another aspect of the present invention, there is provided a method for producing a semiconductor thin film, comprising the steps of: i) forming a self-assembled monolayer on an insulating layer wherein the self-assembled monolayer is formed using the precursor compound of Formula 1; ii) forming an inorganic seed layer on the self-assembled monolayer; and iii) forming a semiconductor layer on the inorganic seed layer.

BRIEF DESCRIPTION OF THE DRAWINGS

The above and other features and other advantages of the present invention will be more clearly understood from the following detailed description taken in conjunction with the accompanying drawings, in which.

DESCRIPTION OF THE PREFERRED EMBODIMENTS

The present invention will now be described in more detail with reference to the accompanying drawings.

The present invention is directed to a semiconductor thin film comprising a self-assembled monolayer, an inorganic seed layer and a semiconductor layer formed in this order on an insulating layer wherein the self-assembled monolayer is formed from a precursor compound represented by Formula 1 below:

(1)

wherein X is selected from the group consisting of —SH, —NH$_2$, —SO$_3$H, —SeH, —C$_5$H$_4$N, —COSeH, —COSH, —SH, —OH, —COOH, —CONHOH, —C$_6$H$_4$N$_3$, —NH—C$_6$H$_4$N$_3$, —O—C$_6$H$_4$N$_3$, —OC(=O)C$_6$H$_4$N$_3$, —OPO$_3$H$_2$, —PO$_3$H$_2$, amino, and phosphinyl;

Y is selected from the group consisting of substituted and unsubstituted C$_1$-C$_{10}$ alkylene, substituted and unsubstituted C$_1$-C$_{10}$ alkenylene, substituted and unsubstituted C$_1$-C$_{10}$ alkynylene, substituted and unsubstituted C$_6$-C$_{20}$ arylene, and substituted and unsubstituted C$_6$-C$_{20}$ arylalkylene groups; and R$_1$, R$_2$ and R$_3$ are each independently selected from the group consisting of a hydrogen atom, substituted and unsubstituted C$_1$-C$_3$ alkyl groups, substituted and unsubstituted C$_1$-C$_{10}$ alkoxy groups, and a halogen atom, with the proviso that at least one of R$_1$, R$_2$ and R$_3$ is a hydrolyzable group.

In one embodiment, the semi-conductor thin film comprises a self-assembled monolayer disposed upon the insulating layer. Disposed upon and in intimate contact with the self-assembled monolayer is the inorganic seed layer. Disposed upon and in intimate contact with the inorganic seed layer is the semi-conductor layer.

The term "self-assembled monolayer (SAM)" as used herein refers to a thin monolayer in which surface active molecules are spontaneously adsorbed on the surface of a particular substrate (e.g., a metal or a metal oxide) to form chemical bonds between the surface active molecules and the substrate. The shape and physical properties of the self-assembled monolayer can be controlled and modified on a molecular level.

According to the semiconductor thin film of the present invention, a self-assembled monolayer (SAM) is formed using the precursor compound of Formula 1 on an insulating layer. An inorganic seed layer is introduced on top of the self-assembled monolayer, resulting in the formation of strong bonds with an organic or inorganic semiconductor material constituting the semiconductor layer. As noted above, the semiconductor layer is disposed upon the inorganic seed layer. The strong bonds thus formed enhance interfacial adhesion between the insulating layer and the semiconductor layer. In one embodiment, when the semiconductor layer is made of an organic semiconductor material, the crystallinity of the semiconductor thin film according to the present invention can be improved. The self-assembled monolayer is easy to form and is reproducible, enabling the production of a defect-free, high-quality semiconductor thin film.

The inorganic seed layer of the semiconductor thin film according to the present invention has a structure of Formula 2 below:

wherein M is a metal atom selected from the group consisting of Group II, III and IV elements; and X is a Group VI chalcogen element.

Specifically, in Formula 2, M is selected from the group consisting of cadmium (Cd), zinc (Zn), mercury (Hg), gallium (Ga), indium (In), lead (Pb) and tin (Sn), and X is selected from the group consisting of sulfur (S), selenium (Se) and tellurium (Te).

The inorganic seed layer can be formed by introducing an M-X group to react with the reactive ends of the self-assembled monolayer. Specifically, when a chalcogen element (e.g., S or Se) constitutes the reactive ends of the self-assembled monolayer, a Group II, III or IV metal source facilitates the formation of M-X bonds thereby forming a bond with the self-assembled monolayer. When the self-assembled monolayer has a terminal group (e.g., N, P or COO—) with at least one unshared pair of electrons, the terminal group can be coordinately bound to a central metal. Accordingly, the use of both M and X sources enables the formation of the inorganic seed layer having the structure of Formula 2 on the self-assembled monolayer.

For example, when the self-assembled monolayer is terminated with —SH, a precursor, e.g., Cd(Ac)$_2$, CdCl$_2$ or Cd(CO)$_2$, is used to form Cd—S bonds on the monolayer. When the self-assembled monolayer is terminated with —NH$_2$, a precursor, e.g., Cd(Ac)$_2$, CdCl$_2$ or Cd(CO)$_2$, and thioacetic acid can be reacted together to form the inorganic seed layer.

The semiconductor layer formed adjacent to the inorganic seed layer may be an inorganic semiconductor layer using an inorganic semiconductor material or an organic-inorganic hybrid semiconductor layer using organic and inorganic semiconductor materials.

In one embodiment of the present invention, the inorganic semiconductor layer may be a chalcogenide semiconductor layer having a hexagonal structure of M-X, which is formed from a precursor compound represented by Formula 3 below:

(3)

wherein L is selected from the group consisting of 2,3-lutidine, 2,4-lutidine, 2,5-lutidine, 2,6-lutidine, 3,4-lutidine, 3,5-lutidine, 3,6-lutidine, 2,6-lutidine-$\alpha^2$,3-diol, 2-hydroxypyridine, 3-hydroxypyridine, 4-hydroxypyridine, 2-hydroxyquinoline, 6-hydroxyquinoline, 8-hydroxyquinoline, 8-hydroxy-2-quinolinecarbonitrile, 8-hydroxy-2-quinolinecarboxylic acid, 2-hydroxy-4-(trifluoromethyl)pyridine, and N,N,N,N-tetramethylethylenediamine;

M is a metal atom selected from the group consisting of Group II, III and IV elements;

X is a Group VI chalcogen element;

R is hydrogen, substituted or unsubstituted $C_1$-$C_{30}$ alkyl, substituted or unsubstituted $C_1$-$C_{30}$ alkenyl, substituted or unsubstituted $C_1$-$C_{30}$ alkynyl, substituted or unsubstituted $C_2$-$C_{30}$ alkoxy, substituted or unsubstituted $C_6$-$C_{30}$ aryl, substituted or unsubstituted $C_6$-$C_{30}$ aryloxy, substituted or unsubstituted $C_2$-$C_{30}$ heteroaryl, substituted or unsubstituted $C_2$-$C_{30}$ heteroaryloxy, or substituted or unsubstituted $C_2$-$C_{30}$ heteroarylalkyl;

a is an integer from 0 to 2; and b is 2 or 3.

In Formula 3, M is selected from the group consisting of cadmium (Cd), zinc (Zn), mercury (Hg), gallium (Ga), indium (In), lead (Pb) and tin (Sn), and X is selected from the group consisting of sulfur (S), selenium (Se) and tellurium (Te).

In one embodiment, the semiconductor thin film comprises a compound represented by Formula 4 below:

(4)

When the chalcogenide semiconductor layer is laminated on the inorganic seed layer, it has the same crystal structure (M-X) as that of the inorganic seed layer. As a result, the inorganic seed layer allows the self-assembled monolayer and the semiconductor layer to connect to each other, and this serves to reduce the surface tension between the self-assembled monolayer and the semiconductor layer, thus enabling the production of a defect-free semiconductor thin film. In addition, the crystallinity of the semiconductor thin film according to the present invention is improved and thus an improvement in charge carrier mobility can be expected.

Since the semiconductor thin film of the present invention solves problems encountered at the interface between an insulating layer and a semiconductor material, it can be effectively used in the fabrication of a variety of electronic devices, including thin film transistors, electroluminescence devices, photovoltaic cells and memory devices. The semiconductor thin film of the present invention can be applied to the devices by processes commonly known in the art.

On the other hand, the semiconductor thin film of the present invention may be produced by forming the self-assembled monolayer alone on the insulating layer without the formation of the inorganic seed layer to facilitate the attainment of enhanced interfacial adhesion of the insulating layer to the semiconductor layer.

That is, the semiconductor thin film of the present invention comprises a self-assembled monolayer, an inorganic seed layer and a semiconductor layer formed in this order on an insulating layer wherein the self-assembled monolayer is formed from a precursor compound represented by Formula 1 below:

(1)

wherein X is selected from the group consisting of —SH, —NH$_2$, —SO$_3$H, —SeH, —C$_5$H$_4$N, —COSeH, —COSH, —SH, —OH, —COOH, —CONHOH, —C$_6$H$_4$N$_3$, —NH—C$_6$H$_4$N$_3$, —O—C$_6$H$_4$N$_3$, —OC(=O)C$_6$H$_4$N$_3$, —OPO$_3$H$_2$, —PO$_3$H$_2$, amino, and phosphinyl;

Y is selected from the group consisting of substituted and unsubstituted $C_1$-$C_{10}$ alkylene, substituted and unsubstituted $C_1$-$C_{10}$ alkenylene, substituted and unsubstituted $C_1$-$C_{10}$ alkynylene, substituted and unsubstituted $C_6$-$C_{20}$ arylene, and substituted and unsubstituted $C_6$-$C_{20}$ arylalkylene groups; and $R_1$, $R_2$ and $R_3$ are each independently selected from the group consisting of a hydrogen atom, substituted and unsubstituted $C_1$-$C_3$ alkyl groups, substituted and unsubstituted $C_1$-$C_{10}$ alkoxy groups, and a halogen atom, with the proviso that at least one of $R_1$, $R_2$ and $R_3$ is a hydrolysable group.

According to the semiconductor thin film of the present invention, the self-assembled monolayer having terminal groups with many unshared pairs of electrons offer electronic stability to the overlying metal source so that the adhesion between the insulating layer and the semiconductor layer can be enhanced and the crystallinity of the semiconductor thin film can be improved.

In another aspect, the present invention is also directed to a method for producing the semiconductor thin film.

Specifically, the method of the present invention comprises the steps of:

i) forming a self-assembled monolayer on an insulating layer wherein the self-assembled monolayer is formed using the precursor compound of Formula 1;

ii) forming an inorganic seed layer on the self-assembled monolayer; and iii) forming a semiconductor layer on the inorganic seed layer.

More specifically, two methods according to embodiments of the present invention are depicted in the following reactions 1 and 2, respectively:

According to the methods depicted in Reactions 1 and 2, a hydroxyl group introduced in the insulating layer facilitates the formation of a self-assembled monolayer.

The precursor compound of Formula 1 is used to form a self-assembled monolayer in the form of a monolayer of a silicate compound. Specifically, as the precursor compound of Formula 1, there can be exemplified a methoxysilane compound containing a substituent, such as thiol or amine.

Next an inorganic seed layer having a structure of M-X is formed on the self-assembled monolayer. Depending on the type of the precursor compound, the inorganic seed layer may be formed into a monolayer having a structure of M-X, or the inorganic seed layer may be formed into a monolayer having a structure of M-X, together with a subsequent chalcogenide semiconductor layer, after being annealed.

Thereafter, the precursor compound of Formula 3 is dissolved in an organic solvent, applied to the inorganic seed layer, and annealed to form a chalcogenide semiconductor layer. The chalcogenide semiconductor layer thus formed has a hexagonal structure that comprises M-X.

The chalcogenide semiconductor layer can be formed into a thin film by common room-temperature wet processes. For example, the chalcogenide semiconductor layer can be formed to a desired thickness by coating techniques, such as spin coating, dip coating, roll coating, screen coating, spray coating, spin casting, flow coating, screen printing, ink jet, and drop casting. In view of ease of coating and thickness uniformity, spin coating is most preferred. Upon spin coating, the spin speed is preferably adjusted within the range of 100 to 10,000 rpm.

Hereinafter, the present invention will be explained in more detail with reference to the following examples. However, these examples are given for the purpose of illustration and are not to be construed as limiting the scope of the invention.

EXAMPLE 1

First, $SiO_2$ was deposited using n-doped Si on a clean glass substrate by CVD to form a 3,000 Å-thick insulating layer. The insulating layer was impregnated with a piranha solution (3:7 (vol/vol) mixture of hydrogen peroxide and sulfuric acid) to treat the surface of the insulating layer. The resulting substrate was washed with distilled water and surface-dried using nitrogen. After the substrate was stood upright in a glass chamber, five drops of mercaptopropyltrimethoxysilane was added and evaporated in an oven at 80° C. for 60 minutes to form a self-assembled monolayer. Then, the self-assembled monolayer was immersed in a solution of 0.001 M $Cd(OAc)_2$ in toluene, followed by stirring at room temperature for 60 minutes to form an inorganic seed layer. A solution of $Lut_2Cd(S(CO)CH_3)_2$ (in which Lut is 3,5-lutidine) (15 wt %) in pyridine was spin-coated on the inorganic seed layer at 500 rpm for 20 seconds. The resulting structure was dried on a hot plate at 100° C. under a nitrogen atmosphere for one minute and annealed under a nitrogen atmosphere at 300° C. for one hour to form a chalcogenide semiconductor layer, completing the production of a semiconductor thin film. Changes after the surface treatment at each of the steps were measured by determining the advancing angle of a single drop of distilled water as a contact angle.

EXAMPLE 2

A semiconductor thin film was produced in the same manner as in Example 1, except that aminopropyltrimethoxysilane was used instead of mercaptopropyltrimethoxysilane, and a solution of 0.001 M $CdCO_3$ and 0.002 M $HSCOCH_3$ in toluene was used instead of a solution of 0.001 M $Cd(OAc)_2$ in toluene.

COMPARATIVE EXAMPLE 1

A semiconductor thin film was produced in the same manner as in Example 1, except that a chalcogenide semiconductor layer was directly formed on an insulating layer without the formation of a self-assembled monolayer and an inorganic seed layer.

To analyze changes in the surface characteristics of the semiconductor thin films produced in Examples 1 and 2 due to the formation of the self-assembled monolayers and the inorganic seed layers, the inner molecular structures and surface of the semiconductor thin films were observed. The results are shown in FIGS. 1 to 4.

Figure 1:
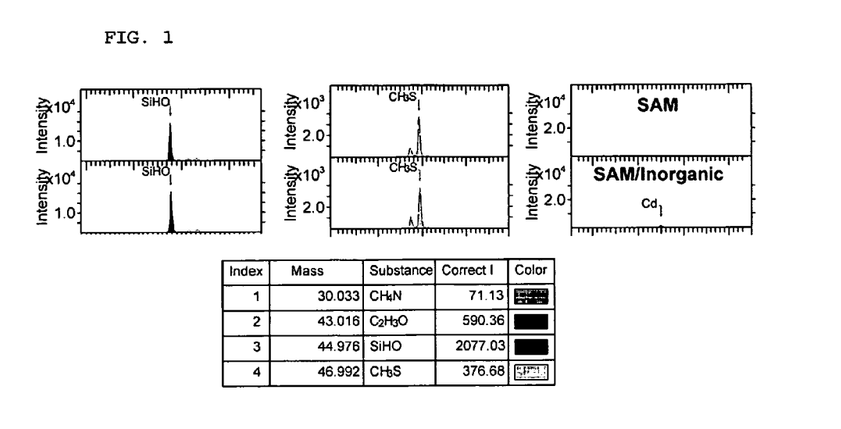
FIG. 1 shows the analytical Time of Flight Secondary-Ion-Mass-Spectrometry (TOF-SIMS) results for the molecular structures of a self-assembled monolayer and an inorganic seed layer of a semiconductor thin film produced according to Example 1.
Figure 2:
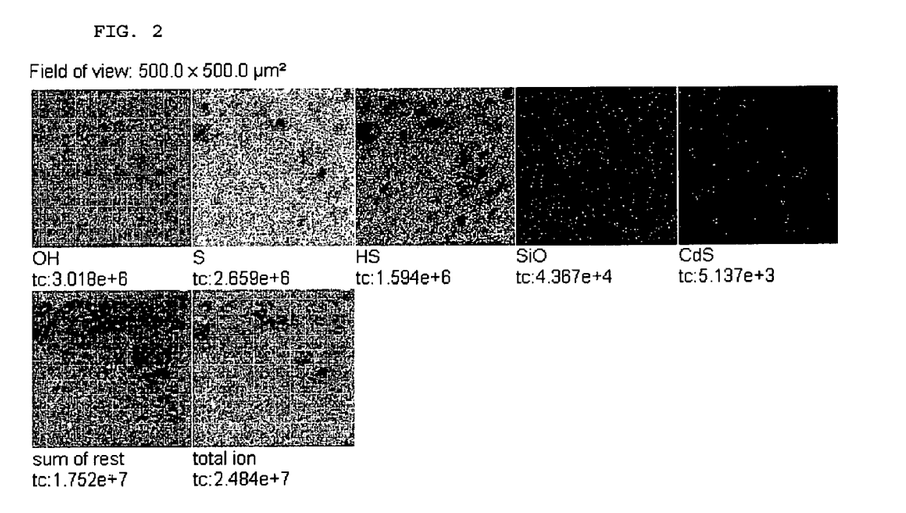
FIG. 2 shows the surface analytical TOF-SIMS results of a self-assembled monolayer and an inorganic seed layer of a semiconductor thin film produced according to Example 1.

FIGS. 1 and 2 are the analytical results of the self-assembled monolayer and the inorganic seed layer of the semiconductor thin film produced in Example 1 of the present invention by Time of Flight Secondary-Ion-Mass-Spectrometry (TOF-SIMS). The analytical results shown in FIGS. 1 and 2 indicate that the self-assembled monolayer is uniformly formed on the insulating layer and the inorganic seed layer of CdS is formed.

Figure 3:
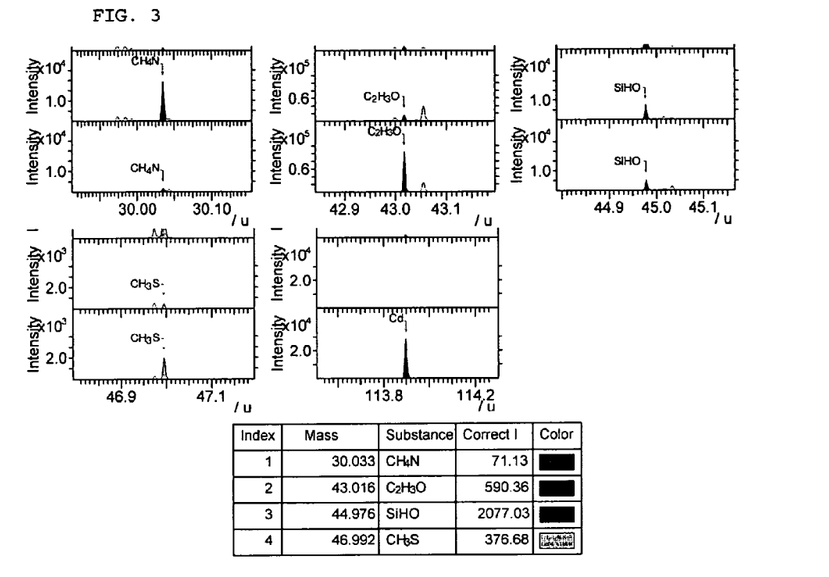
FIG. 3 shows the analytical TOF-SIMS results of the molecular structure of a self-assembled monolayer and an inorganic seed layer of a semiconductor thin film produced according to Example 2.
Figure 4:
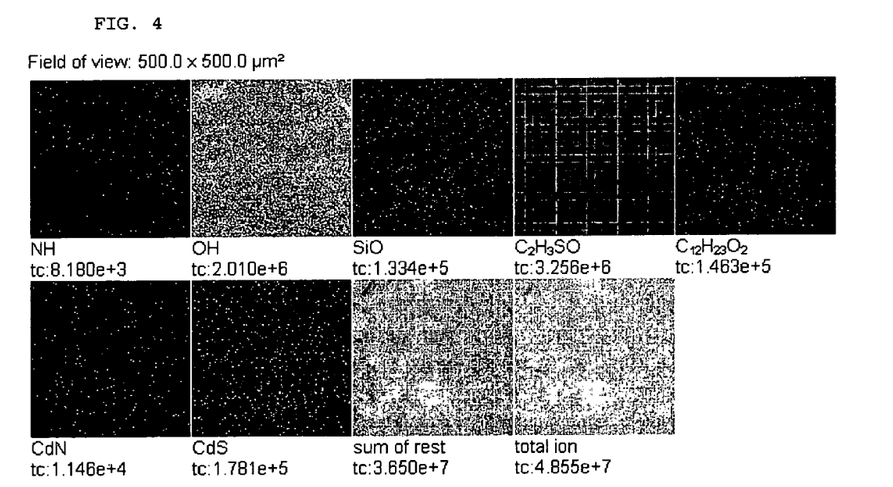
FIG. 4 shows the surface analytical TOF-SIMS characterization of a self-assembled monolayer and an inorganic seed layer of a semiconductor thin film produced according to Example 2.

FIGS. 3 and 4 are the analytical results of the self-assembled monolayer and the inorganic seed layer of the semiconductor thin film produced in Example 2 of the present invention by Time of Flight Secondary-Ion-Mass-Spectrometry (TOF-SIMS). The analytical results shown in FIGS. 3 and 4 indicate that the self-assembled monolayer and the inorganic seed layer of CdS are uniformly formed.

Figure 5:
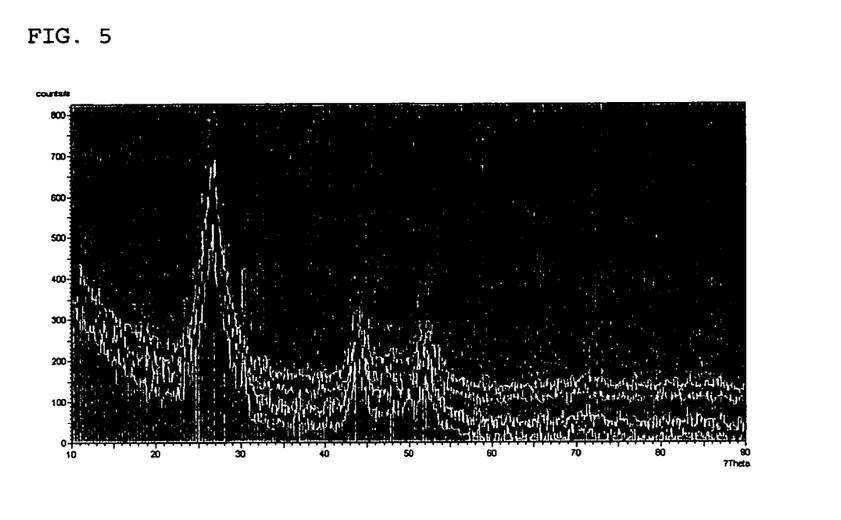
FIG. 5 shows X-ray diffraction (XRD) patterns of semiconductor thin films produced according to Examples 1 and 2 as well as Comparative Example 1.

FIG. 5 shows X-ray diffraction (XRD) patterns of the chalcogenide semiconductor layers of the semiconductor thin films produced in Examples 1 and 2 and Comparative Example 1.

Referring to FIG. 5, the diameters of crystalline domains in the semiconductor thin films produced in Examples 1 and 2 and Comparative Example 1 were found to be 80 Å, 63 Å and 57 Å, respectively, as calculated from the full-width at half-maximum (FWHM) of the peak at 43.7° (2θ). These results demonstrate that the lamination of the chalcogenide semiconductor layers using the self-assembled monolayers leads to improved crystallinity of the thin films.

Figure 6:
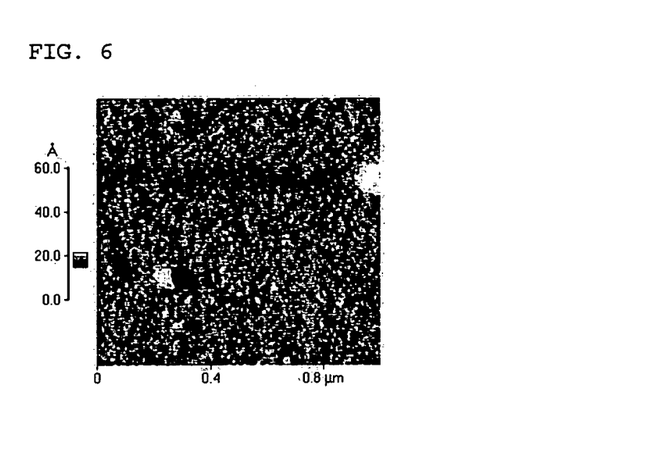
FIG. 6 is an atomic force microscopy (AFM) image of a semiconductor thin film produced according to Example 1.
Figure 7:
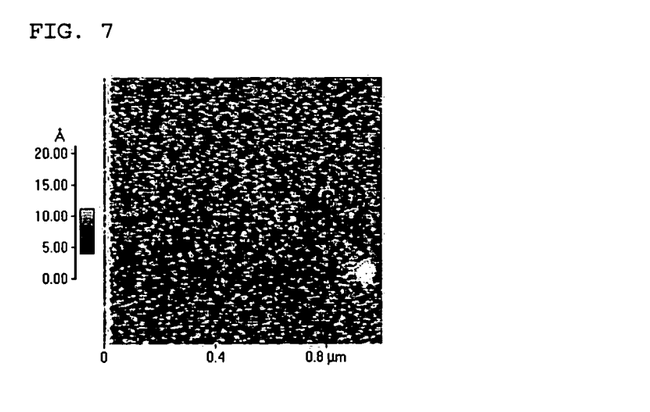
FIG. 7 is an atomic force microscopy (AFM) image of a semiconductor thin film produced according to Example 2.
Figure 8:
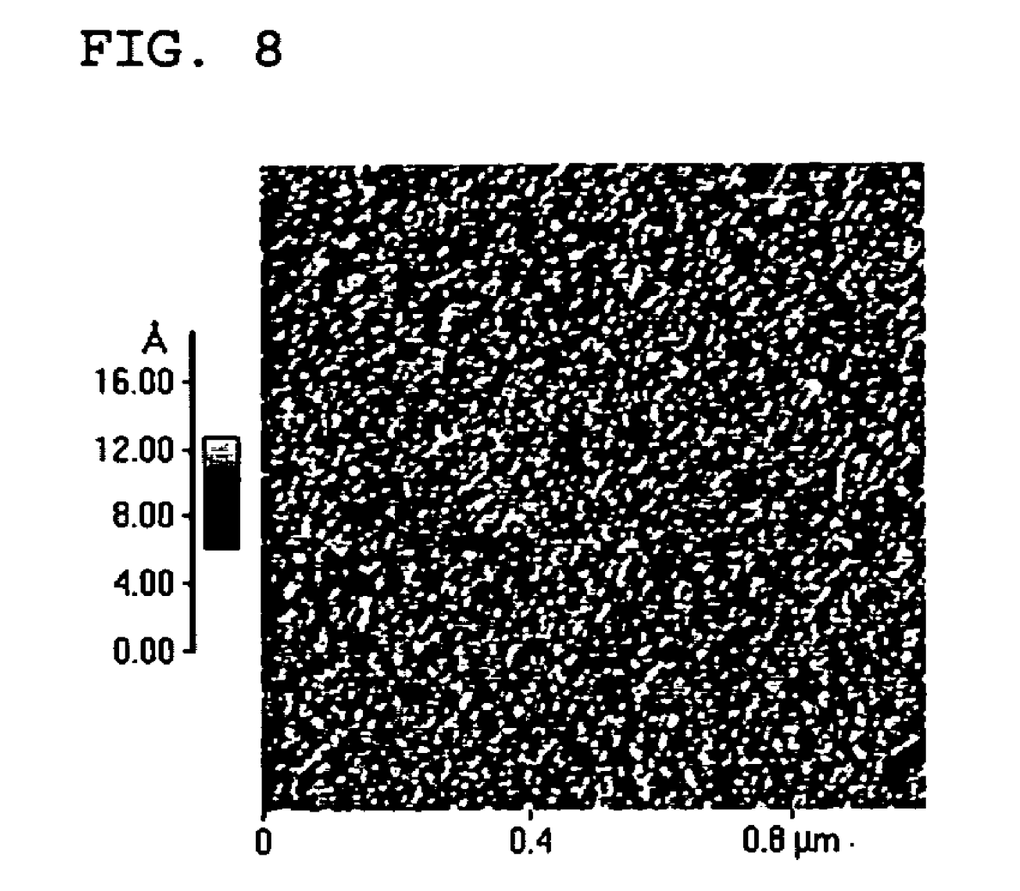
FIG. 8 is an atomic force microscopy (AFM) image of a semiconductor thin film produced according to Comparative Example 1.

FIGS. 6 and 8 are photographs showing the surface of the chalcogenide semiconductor layers of the semiconductor thin films produced in Examples 1 and 2 and Comparative Example 1. The photographs show that the lamination of the chalcogenide semiconductor layers using the self-assembled monolayers leads to uniform morphology of the semiconductor layers.

As is apparent from the foregoing, an inorganic seed layer is introduced into the semiconductor thin film of the present invention by using a self-assembled monolayer (SAM) so that the adhesion between an insulating layer and a semiconductor layer is enhanced and thus the surface tension is reduced, allowing the semiconductor thin film to have high quality without defects. The semiconductor thin film of the present invention can be used in the formation of large-area circuits and can be effectively used to fabricate a variety of electronic devices, including thin film transistors, field-effect transistors, electroluminescence devices, photovoltaic cells and memory devices.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor thin film comprising a self-assembled monolayer, an inorganic seed layer and a semiconductor layer on an insulating layer wherein the self-assembled monolayer is formed on the insulating layer, the inorganic seed layer is formed on the self-assembled monolayer and the semiconductor layer is formed on the inorganic seed layer and wherein the self-assembled monolayer is formed from a precursor compound represented by Formula 1 below:

wherein X is selected from the group consisting of —SH, —$NH_2$, —$SO_3H$, —SeH, —$C_5H_4N$, —COSeH, —COSH, —SH, —OH, —COOH, —CONHOH, —$C_6H_4N_3$, —NH—$C_6H_4N_3$, —O—$C_6H_4N_3$, —OC(=O)$C_6H_4N_3$, —$OPO_3H_2$, —$PO_3H_2$, amino, and phosphinyl;

Y is selected from the group consisting of substituted and unsubstituted $C_1$-$C_{10}$ alkylene, substituted and unsubstituted $C_1$-$C_{10}$ alkenylene, substituted and unsubstituted $C_1$-$C_{10}$ alkynylene, substituted and unsubstituted $C_6$-$C_{20}$ arylene, and substituted and unsubstituted $C_6$-$C_{20}$ arylalkylene groups; and $R_1$, $R_2$ and $R_3$ are each independently selected from the group consisting of a hydrogen atom, substituted and unsubstituted $C_1$-$C_3$ alkyl groups, substituted and unsubstituted $C_1$-$C_{10}$ alkoxy groups, and a halogen atom, with the proviso that at least one of $R_1$, $R_2$ and $R_3$ is a hydrolyzable group.

2. The semiconductor thin film according to claim 1, wherein the inorganic seed layer has a structure represented by Formula 2 below:

$$\text{M-X} \quad (2)$$

wherein M is a metal atom selected from the group consisting of Group II, III and IV elements; and X is a Group VI chalcogen element.

3. The semiconductor thin film according to claim 2, wherein, in Formula 2, M is selected from the group consisting of cadmium (Cd), zinc (Zn), mercury (Hg), gallium (Ga), indium (In), lead (Pb) and tin (Sn), and X is selected from the group consisting of sulfur (S), selenium (Se) and tellurium (Te).

4. The semiconductor thin film according to claim 1, wherein the semiconductor layer is an inorganic or an organic-inorganic hybrid semiconductor layer.

5. The semiconductor thin film according to claim 4, wherein the inorganic semiconductor layer is a chalcogenide semiconductor layer having a hexagonal structure of M-X, which is formed from a precursor compound represented by Formula 3 below:

(3)

wherein L is selected from the group consisting of 2,3-lutidine, 2,4-lutidine, 2,5-lutidine, 2,6-lutidine, 3,4-lutidine, 3,5-lutidine, 3,6-lutidine, 2,6-lutidine-$\alpha^2$,3-diol, 2-hydroxypyridine, 3-hydroxypyridine, 4-hydroxypyridine, 2-hydroxyquinoline, 6-hydroxyquinoline, 8-hydroxyquinoline, 8-hydroxy-2-quinolinecarbonitrile, 8-hydroxy-2-quinolinecarboxylic acid, 2-hydroxy-4-(trifluoromethyl)pyridine, and N,N,N,N-tetramethylethylenediamine;

M is a metal atom selected from the group consisting of Group II, III and IV elements;

X is a Group VI chalcogen element;

R is hydrogen, substituted or unsubstituted $C_1$-$C_{30}$ alkyl, substituted or unsubstituted $C_1$-$C_{30}$ alkenyl, substituted or unsubstituted $C_1$-$C_{30}$ alkynyl, substituted or unsubstituted $C_2$-$C_{30}$ alkoxy, substituted or unsubstituted $C_6$-$C_{30}$ aryl, substituted or unsubstituted $C_6$-$C_{30}$ aryloxy, substituted or unsubstituted $C_2$-$C_{30}$ heteroaryl, substituted or unsubstituted $C_2$-$C_{30}$ heteroaryloxy, or substituted or unsubstituted $C_2$-$C_{30}$ heteroarylalkyl;

a is an integer from 0 to 2; and b is 2 or 3.

6. The semiconductor thin film according to claim 5, wherein, in Formula 3, M is selected from the group consisting of cadmium (Cd), zinc (Zn), mercury (Hg), gallium (Ga), indium (In), lead (Pb) and tin (Sn), and X is selected from the group consisting of sulfur (S), selenium (Se) and tellurium (Te).

7. The semiconductor thin film according to claim 5, wherein the compound is represented by Formula 4 below:

(4)

8. An electronic device comprising the semiconductor thin film according to claim 1.

9. The electronic device according to claim 8, wherein the electronic device is a thin film transistor, a field-effect transistor, an electroluminescence device, a photovoltaic cell, or a memory device.

10. A semiconductor thin film comprising a self-assembled monolayer and an inorganic or organic-inorganic hybrid semiconductor layer formed sequentially on an insulating layer wherein the self-assembled monolayer is formed from a precursor compound represented by Formula 1 below:

(1)

wherein X is selected from the group consisting of —SH, —NH$_2$, —SO$_3$H, —SeH, —C$_5$H$_4$N, —COSeH, —COSH, —SH, —OH, —COOH, —CONHOH, —C$_6$H$_4$N$_3$, —NH—C$_6$H$_4$N$_3$, —O—C$_6$H$_4$N$_3$, —OC(=O)C$_6$H$_4$N$_3$, —OPO$_3$H$_2$, —PO$_3$H$_2$, amino, and phosphinyl;

Y is selected from the group consisting of substituted and unsubstituted $C_1$-$C_{10}$ alkylene, substituted and unsubstituted $C_1$-$C_{10}$ alkenylene, substituted and unsubstituted $C_1$-$C_{10}$ alkynylene, substituted and unsubstituted $C_6$-$C_{20}$ arylene, and substituted and unsubstituted $C_6$-$C_{20}$ arylalkylene groups; and $R_1$, $R_2$ and $R_3$ are each independently selected from the group consisting of a hydrogen atom, substituted and unsubstituted $C_1$-$C_3$ alkyl groups, substituted and unsubstituted $C_1$-$C_{10}$ alkoxy groups, and a halogen atom, with the proviso that at least one of $R_1$, $R_2$ and $R_3$ is a hydrolysable group.

* * * * *

UNITED STATES PATENT AND TRADEMARK OFFICE
CERTIFICATE OF CORRECTION

PATENT NO. : 7,633,087 B2 Page 1 of 1
APPLICATION NO. : 11/417026
DATED : December 15, 2009
INVENTOR(S) : Shin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 718 days.

Signed and Sealed this

Second Day of November, 2010

David J. Kappos
*Director of the United States Patent and Trademark Office*